United States Patent
Li et al.

(10) Patent No.: US 6,608,365 B1
(45) Date of Patent: Aug. 19, 2003

(54) LOW LEAKAGE PMOS ON-CHIP DECOUPLING CAPACITOR CELLS COMPATIBLE WITH STANDARD CMOS CELLS

(75) Inventors: Weidan Li, San Jose, CA (US); Benjamin Mbouombouo, San Jose, CA (US); Johann Leyrer, Munich (DE)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/163,120

(22) Filed: Jun. 4, 2002

(51) Int. Cl.$^7$ ............................................. H01L 29/00
(52) U.S. Cl. ................ 257/532; 257/69; 257/204; 257/338; 257/357; 257/371; 257/516; 257/528; 438/199; 438/210; 438/329
(58) Field of Search ................... 257/532, 69–195, 257/204, 206, 338–350, 351, 357–359, 365–377, 516, 528; 438/199, 957, 210, 329

(56) References Cited

U.S. PATENT DOCUMENTS 6,144,076 A  * 11/2000  Puchner et al. ............. 257/369
6,541,840 B1 *  4/2003  Terayama et al. .......... 257/516

* cited by examiner

*Primary Examiner*—David Nelms
*Assistant Examiner*—Andy Huynh
(74) *Attorney, Agent, or Firm*—Sawyer Law Group LLP

(57) ABSTRACT

An on-chip decoupling capacitor cell is disclosed that is compatible with standard CMOS cells. A cell boundary defining the area of the cell includes a first transistor area and a second transistor area. A PMOS transistor having an n-well is formed within the first transistor area. The on-chip decoupling capacitor cell further includes an n-well extension that extends the n-well into the second transistor area, thereby providing a decoupling capacitor cell having reduced leakage compared to a CMOS capacitor cell, and increased capacitance per unit area compare with a traditional PMOS capacitor cell.

16 Claims, 2 Drawing Sheets

LOW LEAKAGE PMOS ON-CHIP DECOUPLING CAPACITOR CELLS COMPATIBLE WITH STANDARD CMOS CELLS

FIELD OF THE INVENTION

The present invention relates to on-chip decoupling capacitors that are used with CMOS integrated circuits.

BACKGROUND OF THE INVENTION

Power supply noise, simultaneous switching noise, or dynamic switching noise, is one of the most significant noise problems in deep sub-micron integrated circuits. The problem stems from switching noise on the power supply lines that are coupled onto the signal nodes of the circuits. One method for reducing the power supply noise is to scale down the core power supply voltage, such as from 1.8 volts to 1.2 volts, for instance.

The most effective way to reduce power supply noise, however, is to increase on-chip decoupling capacitance. This is typically done in a CMOS (complementary MOS) circuit, for example, by locating on-chip decoupling capacitors next to the standard CMOS cells comprising the circuit.

CMOS is the most widely used type of integrated circuit for digital processors and memories. CMOS uses both p- and n-type MOS (PMOS and NMOS) transistors wired together in its circuits that cause less power to be used than PMOS-only or NMOS-only circuits.

FIGS. 1A and 1B are diagrams illustrating a conventional CMOS decoupling capacitor cell. FIG. 1A is a top view of the CMOS decoupling capacitor cell, and FIG. 1B is a cross-sectional view of the cell. The CMOS decoupling capacitor cell 10 includes a PMOS transistor 12 and an NMOS transistor 14, which are connected between VDD and VSS metal rails 16 and 18. Both transistors 12 and 14 used a thin gate oxide 20 to form the decoupling capacitor. The PMOS transistor 12 includes p-islands 22 formed within and an n-well 24, while the NMOS transistor 14 includes n-islands 26 formed within a p-well 28.

CMOS decoupling capacitor cells 10 are typically located side-by-side with standard CMOS cells (not shown). The n-wells 24 of the PMOS transistors 12 of adjacent cells are aligned to form a row and to thereby achieve higher cell densities. Each CMOS decoupling capacitor cell 10 is separated from the adjacent CMOS cells by a cell boundary 30, which also defines the area for the cell 10.

One requirement for a CMOS decoupling capacitor cell 10 is that it be highly efficient, meaning that its unit area should produce the maximum capacitance with minimal leakage. While conventional CMOS decoupling capacitors cells 10 achieve high capacitance, the NMOS transistor 14 produces a high rate of leakage, due mainly to the nature of the thin gate oxide 30. For example, if a capacitance per cell of 70 nf is required, the leakage current for CMOS decoupling capacitors 10 can be as high as 0.14 mA. Therefore, the leakage per unit capacitance of conventional CMOS decoupling capacitor cells 10 is not optimized.

It has been observed on that in the inversion region, gate leakage for the PMOS transistor 12 is about ten times lower than the for the NMOS transistor 14. Consequently, on-chip decoupling capacitors have been produced that have a single PMOS transistor 12 to improve leakage. However, because the area typically occupied by the NMOS transistor 14 is unused, PMOS decoupling capacitor cells have the disadvantage of having lower capacitance per area than CMOS decoupling capacitor cells 10.

Accordingly, what is needed is an on-chip decoupling capacitor cell having reduced leakage, but that maintains capacitance per area and compatibility with standard CMOS cells. The present invention addresses such a need.

SUMMARY OF THE INVENTION

The present invention provides an on-chip decoupling capacitor cell that is compatible with standard CMOS cells. A cell boundary defining the area of the cell includes a first transistor area and a second transistor area. A PMOS transistor having an n-well is formed within the first transistor area. The on-chip decoupling capacitor cell further includes an n-well extension that extends the n-well into the second transistor area. In one embodiment, the n-well and the n-well extension from a single T-shaped n-well for the PMOS transistor.

According to the present invention, a super capacitance decoupling capacitor (SCAP) cell is provided that has reduced leakage compared with traditional CMOS capacitor cells and greater capacitance per unit area than traditional PMOS capacitor cells.

DETAILED DESCRIPTION

The present invention relates to on-chip decoupling capacitors. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a super capacitor on-chip decoupling capacitor cell (SCAP) comprising a single PMOS transistor that has reduced leakage compared to traditional CMOS capacitor cells, but greater capacitance than traditional PMOS capacitor cells. In addition, the SCAP cell of the present invention maintains compatibility with standard CMOS Logic cells that may be placed next to the SCAP cell.

Figure 1A:
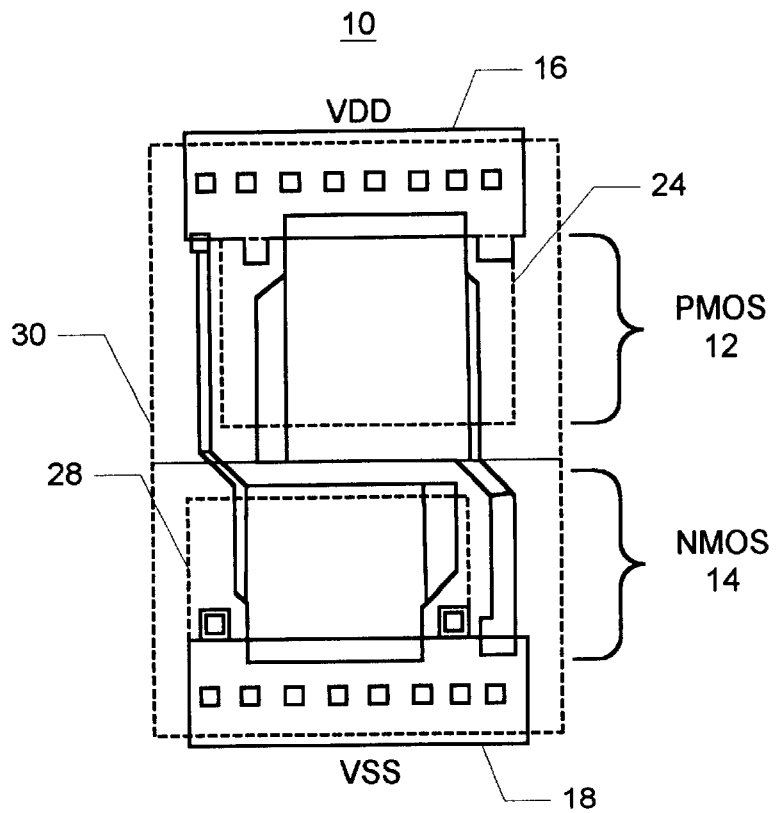
FIGS. 1A and 1B are diagrams illustrating a CMOS conventional decoupling capacitor cell.
Figure 1B:
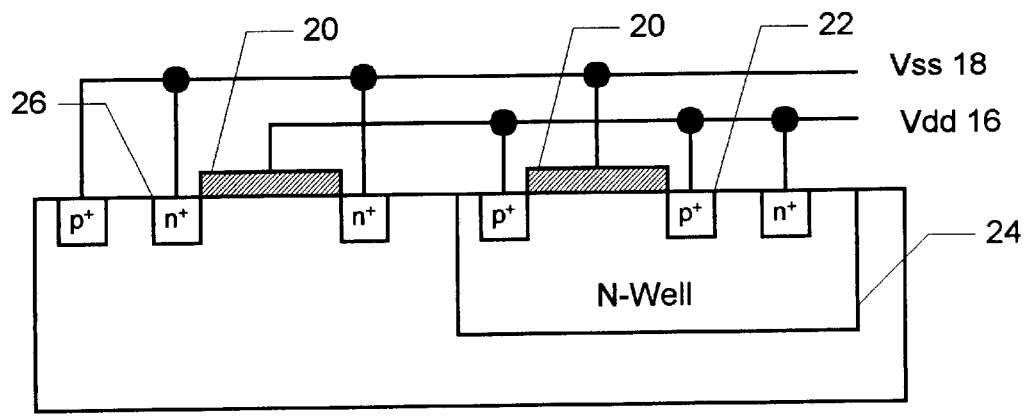
Figure 2A:
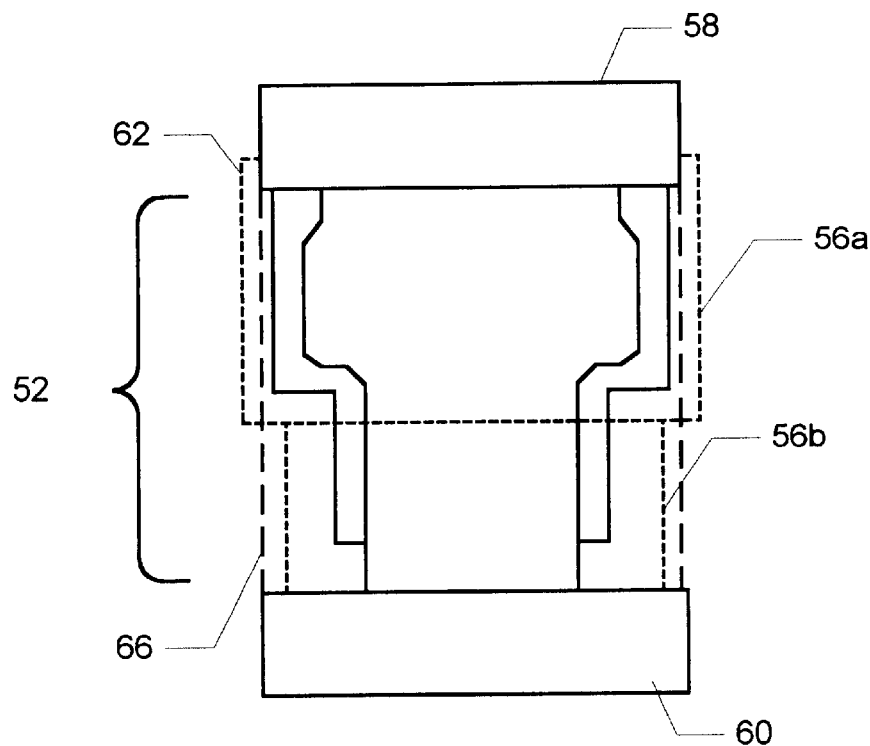
FIG. 2A is a top view of a SCAP cell in a preferred embodiment of the present invention.
Figure 2B:
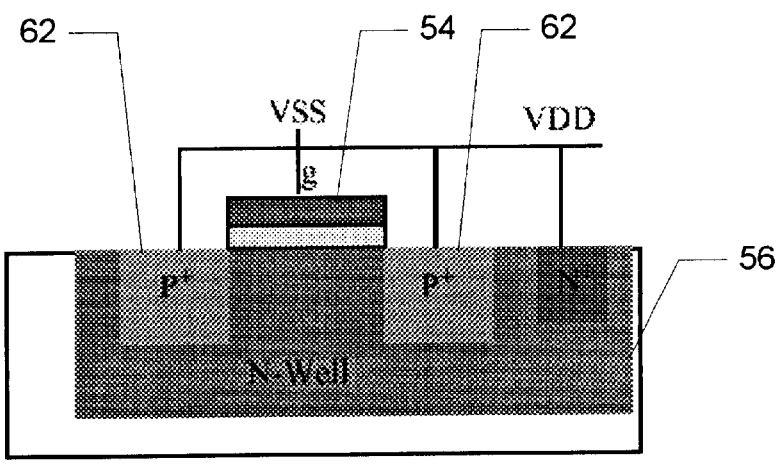
FIG. 2B is a cross-sectional view of the SCAP cell.

FIG. 2A is a top view of the SCAP cell in a preferred embodiment of the present invention, and FIG. 2B is a cross-sectional view of the SCAP cell. The SCAP cell 50 is a modified version of a standard CMOS on-chip decoupling capacitor cell 10 in which the NMOS transistor 14 has been removed. This leaves a single PMOS transistor 52 having a thin gate oxide 54 forming the decoupling capacitor within an n-well 56. The PMOS transistor 52 is connected to VDD and VSS metal rails 58 and 60. Due to the presence of a single PMOS transistor, the SCAP cell 50 is similar to a conventional PMOS on-chip decoupling capacitor cell. However, as stated above, a conventional PMOS on-chip decoupling capacitor leaves the NMOS area of the cell unused, thus reducing the capacitance per area of the cell.

According to the present invention, the SCAP cell 50 is provided with an n-well extension 56b for extending the n-well 56a of the PMOS transistor 52 into the NMOS area of cell 50 in order to increase the capacitance per unit area. In a preferred embodiment, the n-well extension 56b is shaped such that it minimizes any impact on neighboring standard CMOS cells (not shown). That is, to maintain compatibility with standard CMOS cells, the n-well extension 56b should not interfere with the p-well and n-islands of the NMOS transistors in the adjacent CMOS cells.

In order to achieve this goal, the present invention forms the n-well extension 56b with a width narrower than the width of the original n-well 56a, such that the n-well 56a and the n-well extension 56b form a single T-shaped n-well 56. The p-islands 62 of the PMOS transistor 52 are likewise extended into the NMOS area following the contours of the T-shaped n-well 56. The preferred minimum distance from the cell boundary 64 to the n-well extension 56b depends on the technology specification being used. However, for a 0.13-micron technology specification, for example, the distance from the cell boundary to the n-well extension 56b may be approximately 0.55 microns, for instance.

When compared to a 6 grid standard CMOS decoupling capacitor cell, it has been estimated that the SCAP cell 50 of the present invention reduces leakage by approximately 4.2 times (414%), while capacitance per unit area of the cell increases slightly by approximately 19%.

A low-leakage PMOS on-chip decoupling capacitor that is compatible with standard CMOS cells has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. An on-chip decoupling capacitor cell that is compatible with standard CMOS cells, comprising:
   a cell boundary defining an area of the cell, the area of the cell including a first transistor area and a second transistor area;
   a PMOS transistor formed within the first transistor area, the PMOS transistor including an n-well; and
   an n-well extension that extends the n-well into the second transistor area, thereby providing a decoupling capacitor cell having reduced leakage and increased capacitance per unit area.

2. The capacitor cell of claim 1 wherein the n-well extension has a width narrower than a width of the n-well of the PMOS transistor.

3. The capacitor cell of claim 2 wherein the n-well and the n-well extension form a single T-shaped n-well.

4. The capacitor cell of claim 3 wherein the PMOS transistor includes p-islands formed in the T-shaped n-well that extend from the first transistor area into the second transistor area.

5. The capacitor cell of claim 4 wherein the cells are fabricated using a 0.13-micron technology specification, and the n-well extension is approximately 0.55 microns in distance from the cell boundary.

6. The capacitor cell of claim 3 wherein the first and second transistor areas correspond to a PMOS transistor and an NMOS transistor, respectively, in the standard CMOS cells, which are located adjacent to the decoupling capacitor in an integrated circuit.

7. A method for reducing leakage of an on-chip decoupling capacitor cell that is compatible with neighboring standard CMOS cells, wherein adjacent cells are aligned such that NMOS areas of cells form a row, the method comprising the steps of:
   (a) providing the decoupling capacitor cell with a single PMOS transistor, wherein the PMOS transistor includes an n-well; and
   (b) extending the n-well into the NMOS area of cell, such that the extended n-well minimizes any impact on the neighboring standard CMOS cell.

8. The method of claim 7 further including the step of forming the n-well extension with a width narrower than a width of the n-well of the PMOS transistor.

9. The method of claim 8 further including the step of: providing the n-well extension such that the n-well and the n-well extension form a single T-shaped n-well.

10. The method of claim 9 further including the step of: extending the p-islands of the PMOS transistor into the NMOS area such that the p-islands follow the contours of the T-shaped n-well.

11. The method of claim 10 wherein the cells are fabricated using a 0.13-micron technology specification, step (b) further including the step of: providing the n-well extension such that the n-well extension is approximately 0.55 microns in distance from a cell boundary.

12. A method for reducing leakage of an on-chip decoupling capacitor cell that is compatible with a neighboring standard CMOS cell, the standard CMOS cell including a PMOS transistor area and an NMOS transistor area, the method comprising the steps of:
   (a) providing the decoupling capacitor cell with a single PMOS transistor, wherein the PMOS transistor includes an n-well and at least one p-island formed in the n-well; and
   (b) extending the n-well and the at least one p-island into an area of the cell that is adjacent to the NMOS transistor area of the neighboring CMOS cell, such that the extended n-well and p-island minimize any impact on the neighboring standard CMOS cell.

13. The method of claim 12 further including the step of forming the n-well extension with a width narrower than a width of the n-well of the PMOS transistor.

14. The method of claim 13 further including the step of: providing the n-well extension such that the n-well and the n-well extension form a single T-shaped n-well.

15. The method of claim 14 further including the step of: extending the p-islands of the PMOS transistor into the NMOS area such that the p-islands follow the contours of the T-shaped n-well.

16. The method of claim 15 wherein the cells are fabricated using a 0.13-micron technology specification, step (b) further including the step of: providing the n-well extension such that the n-well extension is approximately 0.55 microns in distance from a cell boundary.

* * * * *